United States Patent
Tsutsumi et al.

(10) Patent No.: US 8,874,048 B2
(45) Date of Patent: Oct. 28, 2014

(54) WIRELESS DEVICE, AND INFORMATION PROCESSING APPARATUS AND STORAGE DEVICE INCLUDING THE WIRELESS DEVICE

(75) Inventors: Yukako Tsutsumi, Kawasaki (JP); Koh Hashimoto, Yokohama (JP); Takayoshi Ito, Yokohama (JP); Koji Akita, Yokohama (JP); Keiju Yamada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 194 days.

(21) Appl. No.: 13/603,790

(22) Filed: Sep. 5, 2012

(65) Prior Publication Data
US 2013/0225102 A1  Aug. 29, 2013

(30) Foreign Application Priority Data
Feb. 28, 2012 (JP) .................... 2012-041831

(51) Int. Cl.
  *H03C 1/52* (2006.01)
  *H04B 1/38* (2006.01)

(52) U.S. Cl.
  USPC ................... 455/106; 455/301; 343/841

(58) Field of Classification Search
  USPC ........... 455/106, 300–301; 343/841; 257/660, 257/662–663
  See application file for complete search history.

(56) References Cited

U.S. PATENT DOCUMENTS

| | | | |
|---|---|---|---|
| 5,047,898 A | 9/1991 | Cooke et al. | |
| 6,143,587 A | 11/2000 | Omizo | |
| 6,400,037 B1 | 6/2002 | Omizo | |
| 6,818,985 B1 | 11/2004 | Coccioli et al. | |
| 7,180,012 B2 | 2/2007 | Tsuneoka et al. | |
| 7,917,037 B2 * | 3/2011 | Liu et al. | ......... 398/138 |
| 8,016,184 B2 | 9/2011 | Kanryo et al. | |
| 2001/0008301 A1 | 7/2001 | Terui | |
| 2005/0157476 A1 | 7/2005 | Goudarzi | |
| 2009/0002967 A1 | 1/2009 | Asami | |
| 2009/0194851 A1 | 8/2009 | Chiu et al. | |
| 2009/0256244 A1 | 10/2009 | Liao et al. | |

(Continued)

FOREIGN PATENT DOCUMENTS

| | | |
|---|---|---|
| CN | 101635281 A | 1/2010 |
| JP | 10-092981 A | 4/1998 |

(Continued)

OTHER PUBLICATIONS

U.S. Appl. No. 13/940,022, First Named Inventor: Koh Hashimoto, Filed: Jul. 11, 2013, Title: "Wireless Device, and Information Processing Apparatus and Storage Device Including the Wireless Device".

(Continued)

*Primary Examiner* — Lee Nguyen
(74) *Attorney, Agent, or Firm* — Holtz, Holtz, Goodman & Chick PC

(57) ABSTRACT

According to one embodiment, a wireless device includes a board, a semiconductor chip, a radiation element, a sealing resin, a conductive layer, and a first conductive wall. The semiconductor chip is mounted on the board and includes a transmission/reception circuit. The radiation element is formed on the board. The sealing resin seals the semiconductor chip. The conductive layer covers at least a portion of a surface of the sealing resin. The first conductive wall is provided between the semiconductor chip and the radiation element and is connected to the conductive layer.

12 Claims, 19 Drawing Sheets

(56) References Cited

U.S. PATENT DOCUMENTS

| | | |
|---|---|---|
| 2010/0013064 A1 | 1/2010 | Hsu |
| 2010/0032815 A1 | 2/2010 | An et al. |
| 2010/0207259 A1 | 8/2010 | Liao et al. |
| 2010/0214390 A1 | 8/2010 | Tsujino et al. |
| 2011/0006408 A1 | 1/2011 | Liao |
| 2012/0015687 A1 | 1/2012 | Yamada et al. |
| 2012/0193770 A1 | 8/2012 | Yamada et al. |
| 2013/0027255 A1 | 1/2013 | Ito et al. |
| 2013/0222196 A1 | 8/2013 | Hashimoto et al. |
| 2013/0222401 A1 | 8/2013 | Ito et al. |

FOREIGN PATENT DOCUMENTS

| | | |
|---|---|---|
| JP | 2002-9207 A | 1/2002 |
| JP | 2003234615 A | 8/2003 |
| JP | 2004095607 A | 3/2004 |
| JP | 2004-172176 A | 6/2004 |
| JP | 2004159029 A | 6/2004 |
| JP | 2006-173493 A | 6/2006 |
| JP | 2007157891 A | 6/2007 |
| JP | 2009-218484 A | 9/2009 |
| JP | 2010-103574 A | 5/2010 |
| JP | 2010-226137 A | 10/2010 |
| JP | 2010-245931 A | 10/2010 |
| JP | 2010278325 A | 12/2010 |
| JP | 2012-39104 A | 2/2012 |
| TW | 201008478 A | 2/2010 |
| TW | 201101452 A | 1/2011 |

OTHER PUBLICATIONS

U.S. Appl. No. 13/600,670; First Named Inventor: Takayoshi Ito; Title: "Semiconductor Package, and Information Processing Apparatus and Storage Device Including the Semiconductor Packages"; Filed: Aug. 31, 2012.

U.S. Appl. No. 13/603,864; First Named Inventor: Koh Hashimoto; Title: "Wireless Device, and Information Processing Apparatus and Storage Device Including the Wireless Device"; Filed: Sep. 5, 2012.

U.S. Appl. No. 13/571,523; First Named Inventor: Takayoshi Ito; Filed: Aug. 10, 2012.

U.S. Appl. No. 13/357,866; First Named Inventor: Keiju Yamada; Title: "Semiconductor Device"; Filed: Jan. 25, 2012.

U.S. Appl. No. 13/181,737; First Named Inventor: Keiju Yamada; Title: "Semiconductor Package and Mobile Device Using the Same"; Filed: Jul. 13, 2011.

Japanese Office Action dated Aug. 19, 2014 in counterpart Japanese Application No. 2012-041831.

* cited by examiner

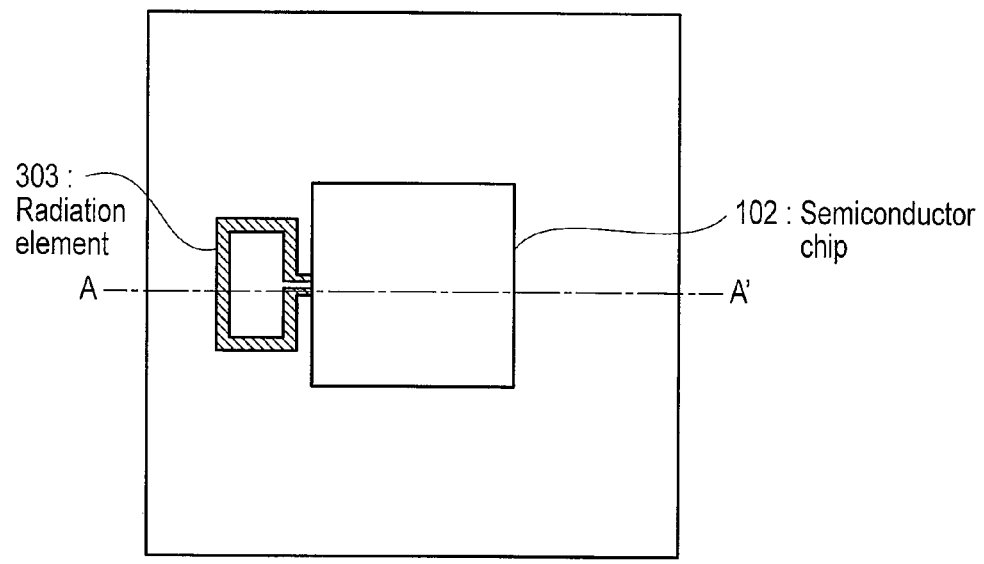
F I G. 3A
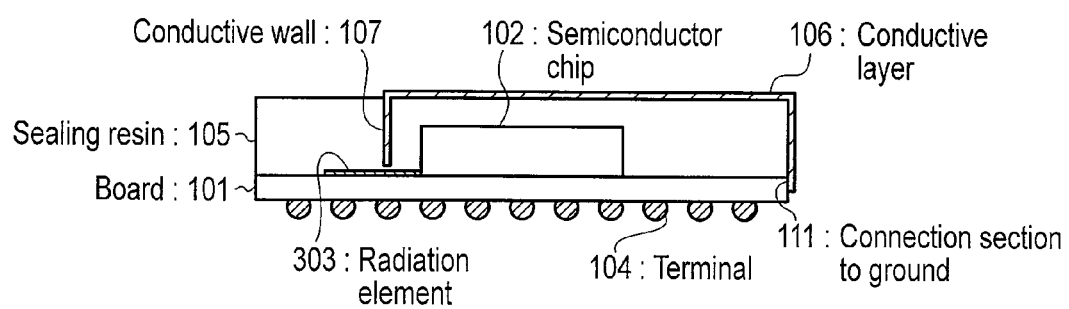
F I G. 3B

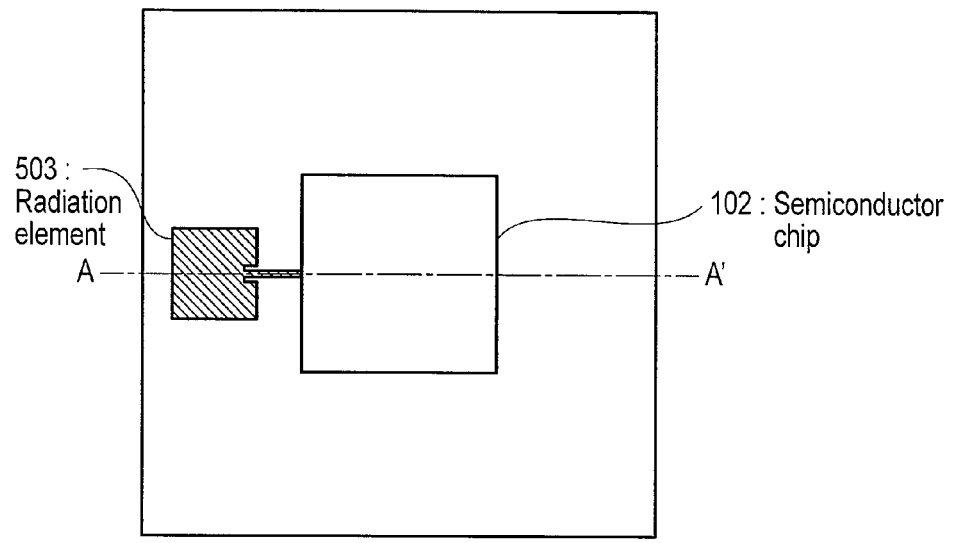
F I G. 5 A
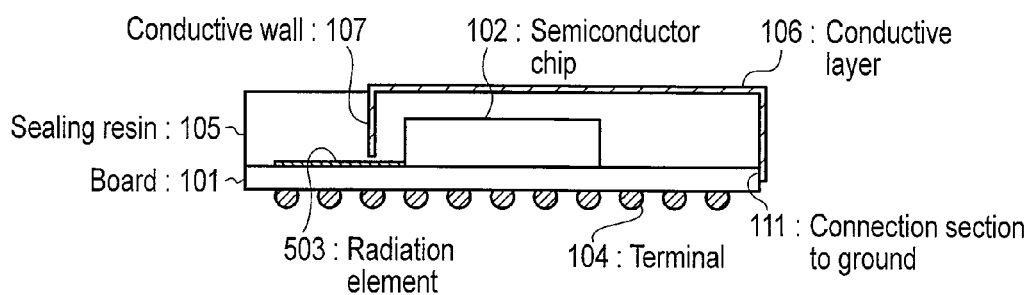
F I G. 5 B

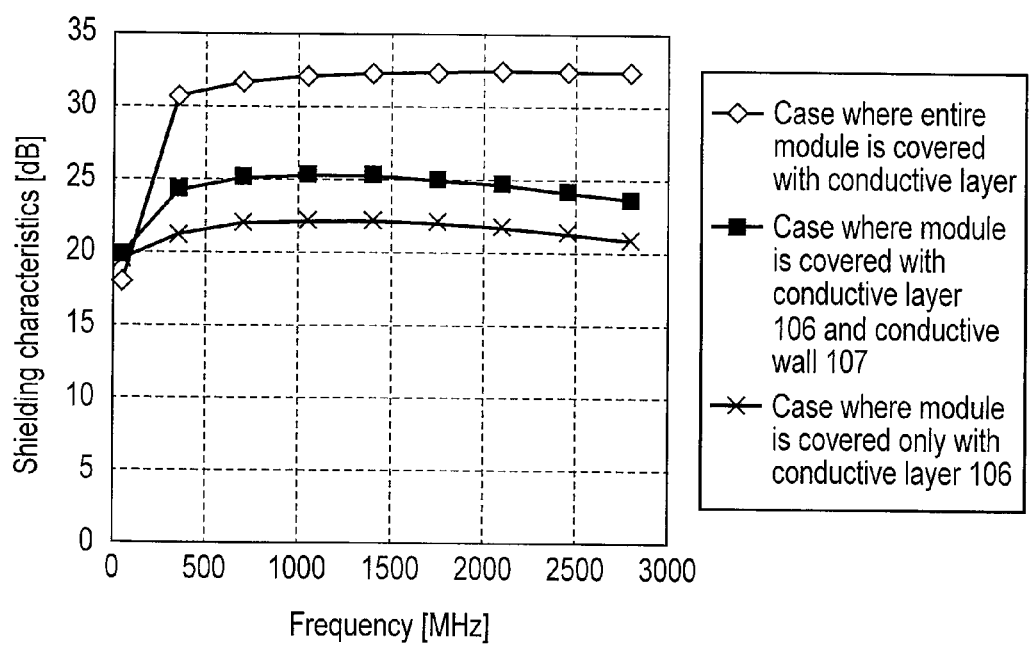
F I G. 7

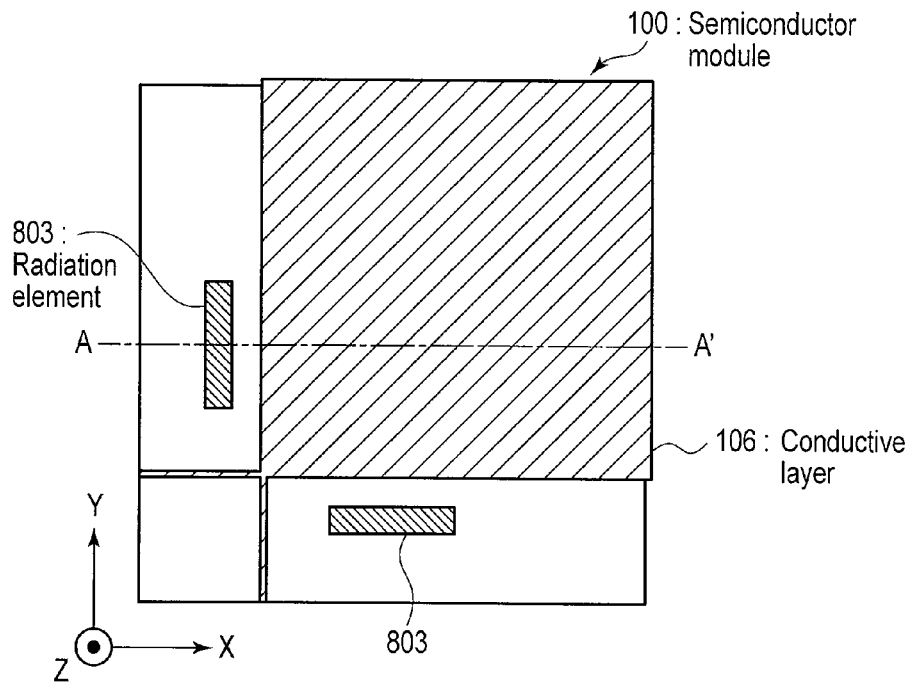
F I G. 8 A
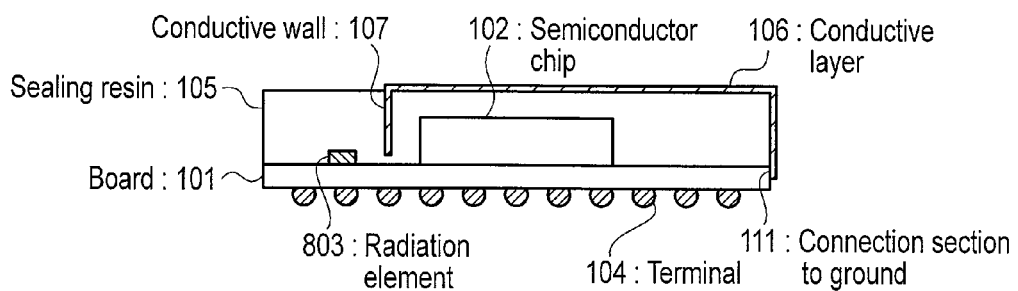
F I G. 8 B

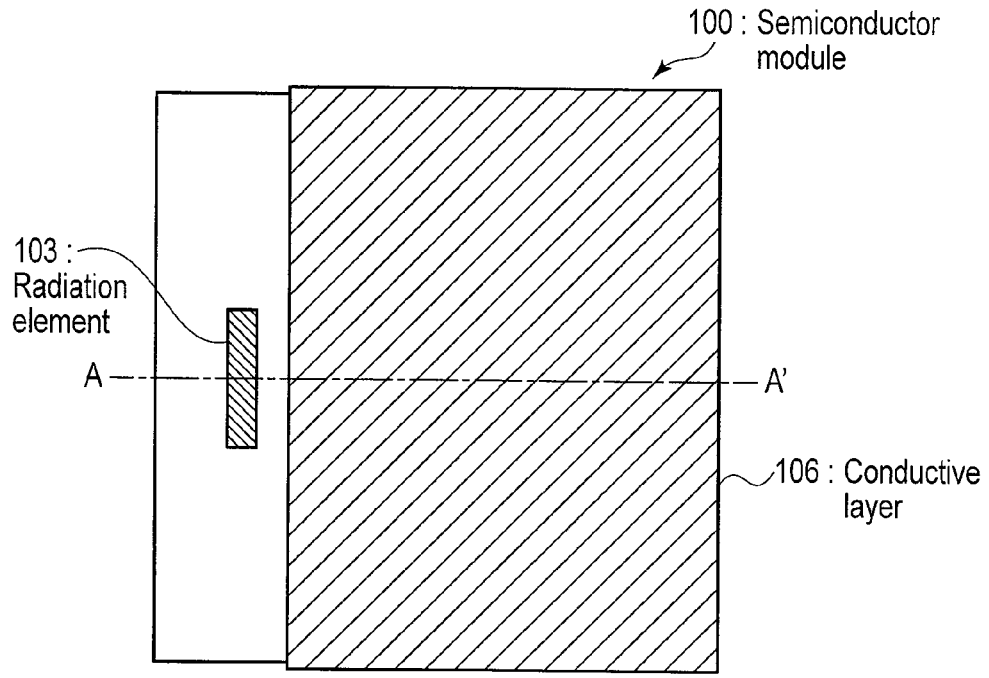
F I G. 14 A
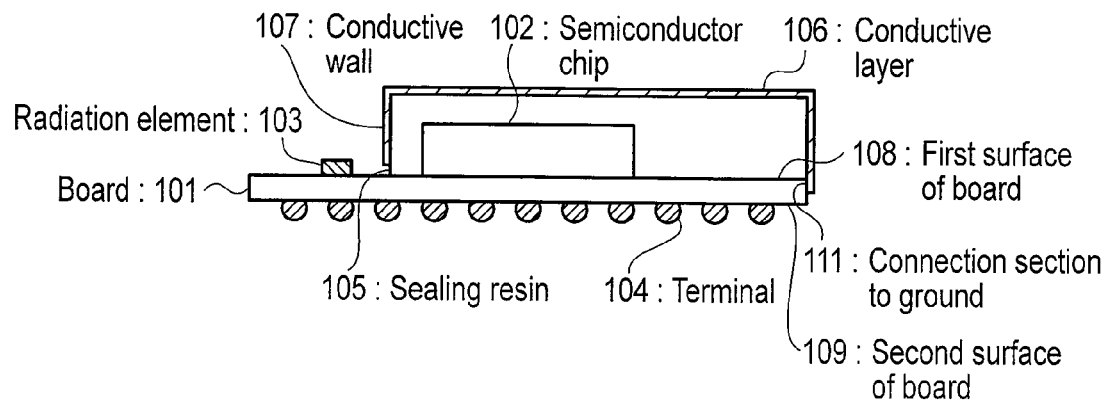
F I G. 14 B

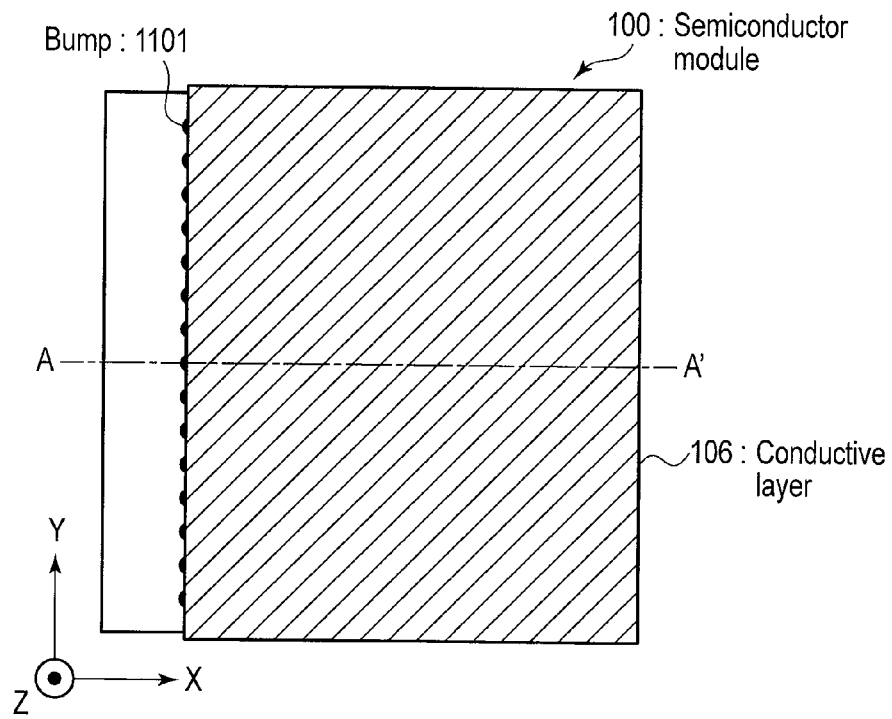
F I G. 1 5 A
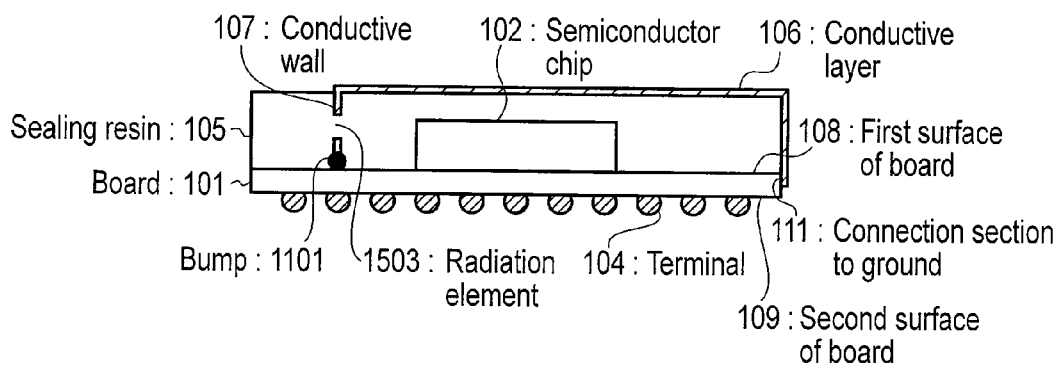
F I G. 1 5 B

WIRELESS DEVICE, AND INFORMATION PROCESSING APPARATUS AND STORAGE DEVICE INCLUDING THE WIRELESS DEVICE

CROSS-REFERENCE TO RELATED APPLICATIONS

This application is based upon and claims the benefit of priority from Japanese Patent Application No. 2012-041831, filed Feb. 28, 2012, the entire contents of which are incorporated herein by reference.

FIELD

Embodiments described herein relate generally to wireless devices, and an information processing apparatus and a storage device including the wireless devices.

BACKGROUND

There are conventional high-frequency modules and a method of producing the modules. In the modules, a high-frequency circuit formed by electrically connecting the antenna of a lead frame to an integrated circuit chip mounted on a die-bonding pad is sealed with a resin mold so that ends of lead terminals are exposed through the mold. Further, the portion of the resultant mold body other than the antenna is covered with a box-shaped shield case formed of a metal.

In this mold body, the required elements are integrated into a compact body, and ground connection between the shield case and the high-frequency circuit is also considered.

In the conventional high-frequency module and its manufacturing method, there is a problem that since a shielded side of the integrated circuit chip around the antenna is open, the shielding effect is reduced. Further, the above structure and method are dedicated to lead-frame structures, and are therefore applicable only to modules or packages including a lead frame.

BRIEF DESCRIPTION OF THE DRAWINGS

FIG. 3A is a top plan view illustrating an example where a radiation element is formed of part of a loop antenna;
FIG. 3B is a cross-sectional view taken along line A-A' of FIG. 3A;
FIG. 5A is a top plan view illustrating an example where a radiation element is formed of the entire patch antenna;
FIG. 5B is a cross-sectional view taken along line A-A' of FIG. 5A;
FIG. 7 is a graph illustrating unnecessary electromagnetic field suppressed amount simulation results;
FIG. 8A is a top plan view schematically illustrating a wireless device according to a second embodiment;
FIG. 8B is a cross-sectional view taken along line A-A' of FIG. 8A;
FIG. 14A is a top plan view schematically illustrating a wireless device according to a fifth embodiment;
FIG. 14B is a cross-sectional view taken along line A-A' of FIG. 14A;
FIG. 15A is a top plan view schematically illustrating a wireless device according to a sixth embodiment;
FIG. 15B is a cross-sectional view taken along line A-A' of FIG. 15A.

DETAILED DESCRIPTION

Figure 1A:
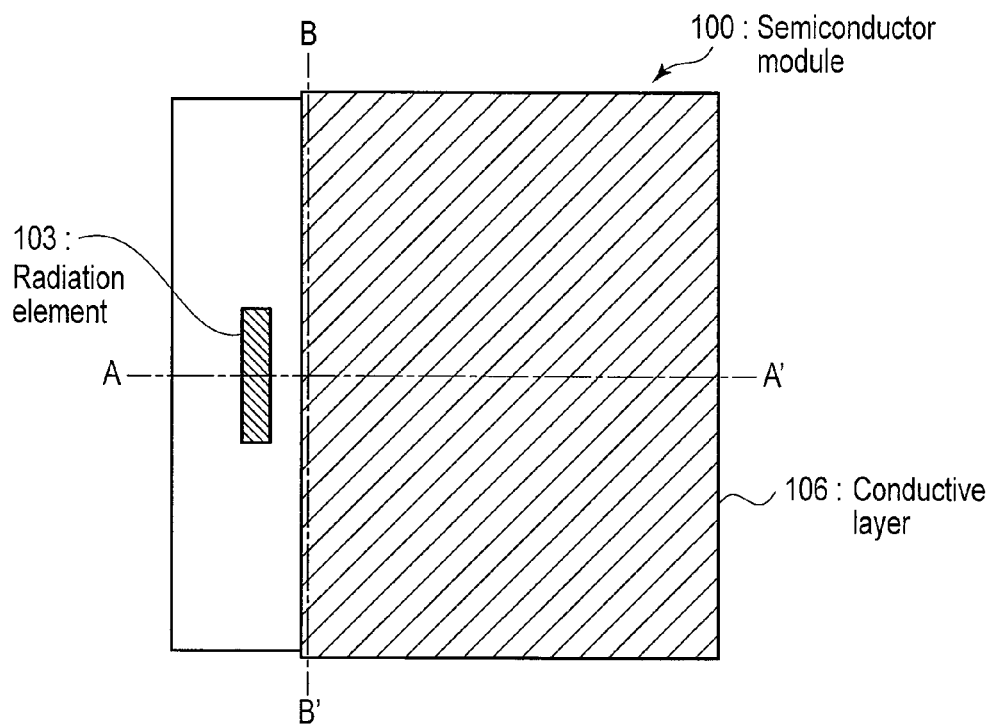
FIG. 1A is a top plan view schematically illustrating a wireless device according to a first embodiment.

Wireless devices, an information processing apparatus and a storage apparatus according to embodiments will be described in detail with reference to the accompanying drawings. In the embodiments, like reference numerals denote like elements, and no duplicate description will be given thereof.

The embodiment aims to provide a wireless device including an antenna capable of efficiently receiving and radiating electromagnetic waves, with its shielding effect enhanced, and also to provide an information processing apparatus and a storage apparatus provided with the wireless device.

In general, according to one embodiment, a wireless device includes a board, a semiconductor chip, a radiation element, a sealing resin, a conductive layer, and a first conductive wall. The semiconductor chip is mounted on the board and includes a transmission/reception circuit. The radiation element is formed on the board. The sealing resin seals the semiconductor chip. The conductive layer covers at least a portion of a surface of the sealing resin. The first conductive wall is provided between the semiconductor chip and the radiation element and is connected to the conductive layer.

First Embodiment

Figure 1B:
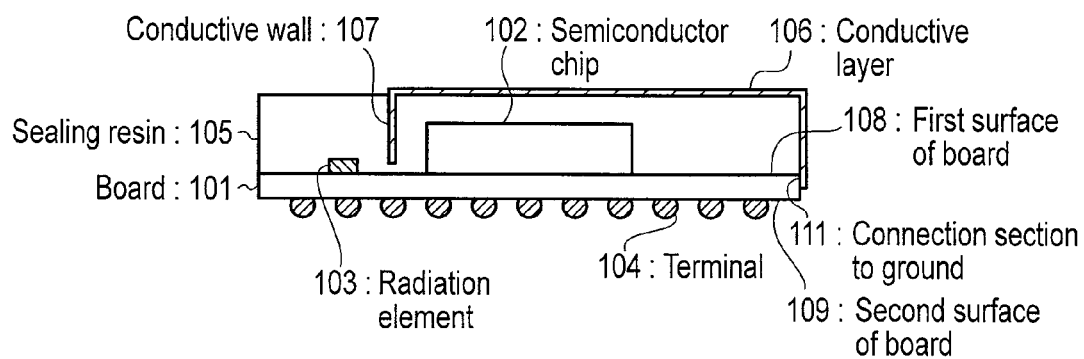
FIG. 1B is a cross-sectional view taken along line A-A' of FIG. 1A.
Figure 1C:
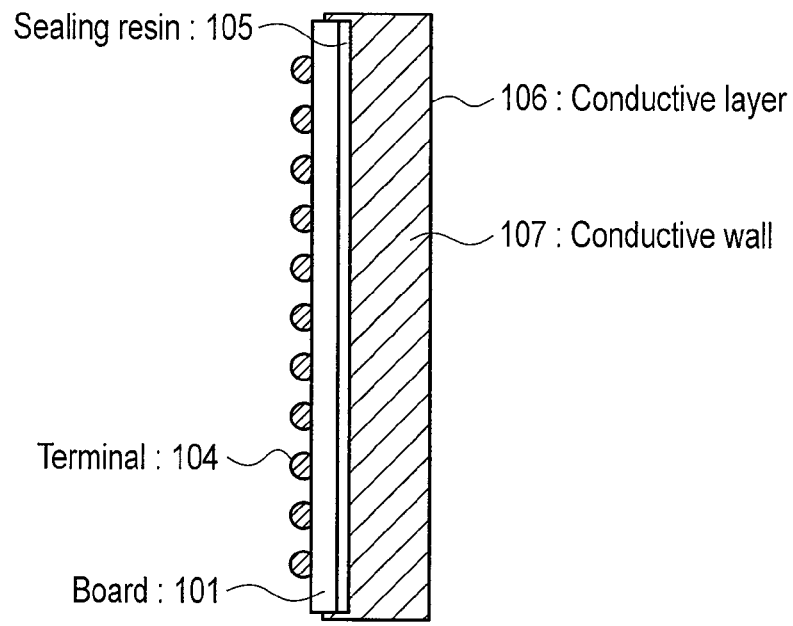
FIG. 1C is a cross-sectional view taken along line B-B' of FIG. 1A.
Figure 1D:
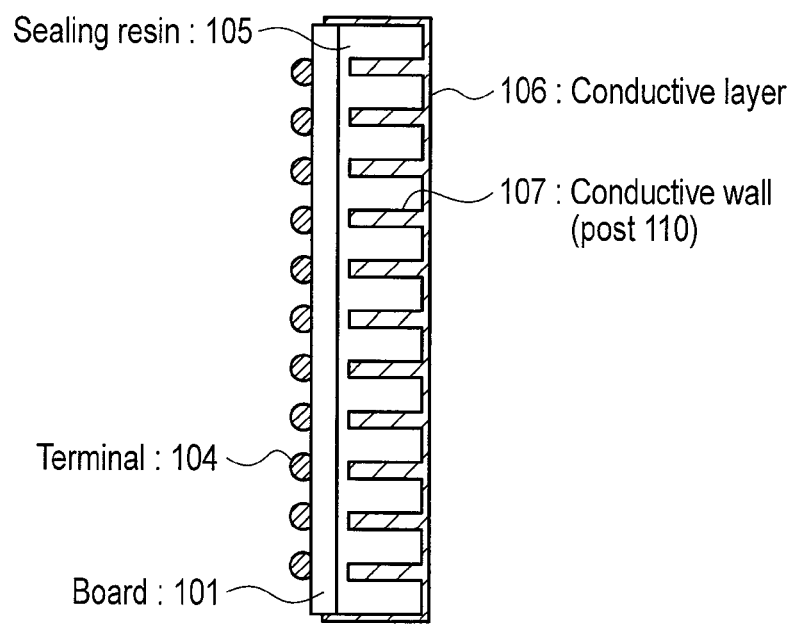
FIG. 1D is a cross-sectional view taken along line B-B' of FIG. 1A and illustrating a modification of the wireless device shown in FIG. 1C.

Referring first to FIGS. 1A, 1B, 1C and 1D, a wireless device according to a first embodiment will be described. FIG. 1A is a top plan view schematically illustrating a wireless device according to a first embodiment. FIG. 1B is a cross-sectional view taken along line A-A' of FIG. 1A. FIGS. 1C and 1D are cross-sectional views taken along lines B-B' of FIG. 1A.

The wireless device shown in FIGS. 1A to 1D comprises a board 101, a semiconductor chip 102, a radiation element 103, terminals 104, a sealing resin 105, a conductive layer 106. The wireless device will also be referred to as a semiconductor module. In the figures, the semiconductor module is denoted by reference numeral 100.

The semiconductor chip 102 is mounted on the first surface 108 of the board 101. The semiconductor chip 102 comprises a signal transmitting/receiving circuit for transmitting and receiving signals. The semiconductor chip 102 comprises a semiconductor substrate formed of, for example, silicon, silicon germanium, or gallium arsenide, and has metal layers of copper, aluminum, gold, etc., formed in its interior or on its surface layer. Alternatively, the semiconductor chip 102 may be formed of a dielectric substrate, a magnetic substrate, a metal, or a combination thereof. Yet alternatively, the semiconductor chip 102 may be formed of a chip size package (CSP). Although only one semiconductor chip 102 is shown in FIGS. 1A and 1B, a plurality of semiconductor chips may be stacked or arranged horizontally. The semiconductor chip 102 is electrically connected to the wiring or the ground of the board 101 via bonding wires or bumps.

The radiation element 103 is formed on the first surface 108 of the board 101 at a position different from that of the semiconductor chip 102. The semiconductor chip 102 is at a certain distance from the radiation element 103. The semiconductor chip 102 and the radiation element 103 are sealed with the sealing resin 105. The radiation element 103 is electrically connected to an antenna terminal (not shown) incorporated in the semiconductor chip 102 via, for example, a bonding wire or a bump. The radiation element 103 is part of an antenna or the entire antenna, which can radiate and receive electrical waves. The radiation element 103 may be formed on the board 101 as shown in FIGS. 1A to 1D. Alternatively, it may be formed of a bonding wire or a bump (not shown). The radiation element 103 is part or the whole of, for example, a dipole antenna, a loop antenna, an inverted F-shaped antenna or a patch antenna.

The terminals 104 are provided on the second surface 109 of the board 101 opposite to the first surface 108 with the semiconductor chip 102 mounted thereon. The terminals 104 are formed of, for example, solder balls.

A conductive wall 107 is formed by filling, with a conductive material, a groove of a certain depth formed between the semiconductor chip 102 and the radiation element 103. This groove does not reach the first surface 108. Namely, the bottom of the groove exists above the first surface 108. The sealing resin 105 exists between the bottom of the groove exists above the first surface 108 of the board 101.

The conductive layer 106 is formed to, cover the part of the sealing resin 105 that is provided on the semiconductor chip 102. In other words, the conductive layer 106 covers at least part of the surface of the sealing resin 105. In view of prevention of leakage of an unintentional electromagnetic field, the conductive layer 106 is preferably formed of a metal layer having a low resistivity, such as a copper, silver or nickel layer. It is preferable to set the thickness of the conductive layer 106 based on the resistivity. For instance, it is preferable to set the thickness of the conductive layer 106 so that the sheet resistance obtained by dividing the resistivity of the conductive layer 106 by its thickness will be 0.5Ω or less. By setting the sheet resistance of the conductive layer 106 to a value not higher than 0.5Ω, leakage of an unintentional electromagnetic field can be suppressed with good repeatability.

If the conductive layer 106 is connected to the ground of the board 101 with low resistance, high shielding effect can be obtained. In contrast, if the conductive layer 106 is not connected to the ground of the board 101 with low resistance, current that occurs in the conductive layer 106 loses its leakage path, and hence an electromagnetic field will be re-radiated at the conductive layer 106, thereby degrading the shielding effect. In the structures shown in FIGS. 1A to 1D, the conductive layer 106 is in contact with a side surface of the board 101, and is connected to the ground of the board 101 at the side surface of the board 101 via a connection section 111 connected to the ground. Alternatively, the conductive layer 106 may be connected to the ground of the board 101 by other means.

The semiconductor module 100 shown in FIG. 1A is a ball grid array (BGA) package with the terminals 104 provided on the second surface 109 of the board 101. However, the semiconductor module 100 is not limited to the BGA package, but may be another type of package or be a module comprising the semiconductor chip and the board. The part of the board 101 covered with the sealing resin 105 may be provided with components, such as a chip capacitor and an IC (not shown), as well as the semiconductor chip 102 and the radiation element 103.

In FIG. 1A, the semiconductor chip 102 and the semiconductor package 100 are square components. However, they are not limited to square ones, but may be formed rectangular, polygonal or circular, or may have other complex shapes.

Referring then to FIGS. 1C and 1D, the conductive wall 107 will be described. The conductive wall 107 shown in FIG. 1D is a modification of the conductive wall 107 shown in FIG. 1C.

The conductive wall 107 interposed between the semiconductor chip 102 and the radiation element 103 is formed as one body integral with the conductive layer 106, and electrically connected thereto. The conductive wall 107 is formed by, for example, filling a groove formed in the sealing resin 105. The conductive layer 106 and the conductive wall 107 shown in FIG. 1C can be formed integral as one body by, for example, performing half dicing on the sealing resin 105 to form a groove, and coating the surface of the sealing resin 105 and the groove therein with a conductive material.

The conductive wall 107 may comprise a plurality of posts 110 as shown in FIG. 10. To prevent leakage of an unintentional electromagnetic field, it is desirable to set the intervals of the plurality of posts 110 to a value not higher than ¼ of the wavelength of the unintentional electromagnetic field. The posts 110 and the conductive layer 106 can be formed integral as one body by, for example, drilling holes in the sealing resin 105, and coating the surface of the sealing resin 105 and the holes therein with a conductive material.

By thus coating the entire surface of the semiconductor module 100 containing an antenna with a conductive layer, the unintentional electromagnetic field generated by the semiconductor chip and the board in the module can be suppressed. However, in this case, radiation and reception of the antenna can also be interrupted. In view of this, in the semiconductor module 100 of the first embodiment, the conductive wall 107 connected to the conductive layer 106 covering the surface of the sealing resin 105 is provided between the semiconductor chip 102 and radiation element 103. As a result, the unintentional electromagnetic field generated by the semiconductor chip 102 and the wiring (not shown) of the board 101 can be blocked, and at the same time, the radiation element 103 can efficiently radiate and receive electromagnetic waves.

Referring then to FIGS. 2A, 2B, 3A, 3B, 4A, 4B, 5A, 5B, 6A and 6B, a modification of the radiation element will be described. These figures show radiation elements corresponding to the radiation element 103. Further, in FIGS. 2A, 3A, 4A and 5A, the conductive layer 106 and the conductive wall 107 are omitted.

Figure 2A:
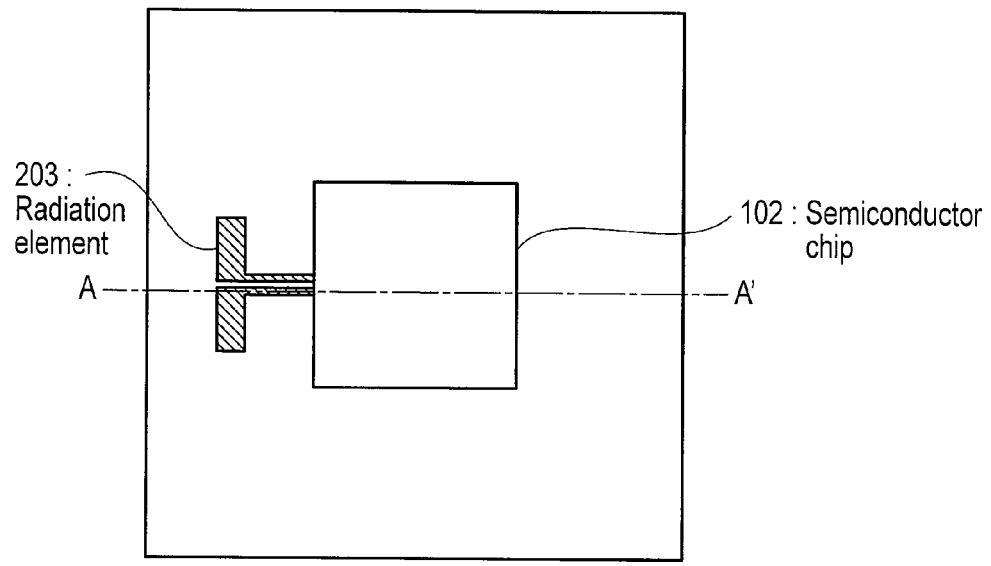
FIG. 2A is a top plan view illustrating an example where a radiation element is formed of the entire dipole antenna.
Figure 2B:
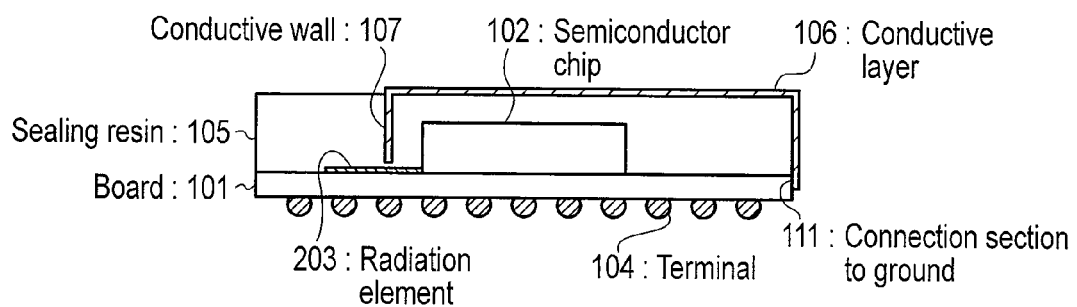
FIG. 2B is a cross-sectional view taken along line A-A' of FIG. 2A.
Figure 4A:
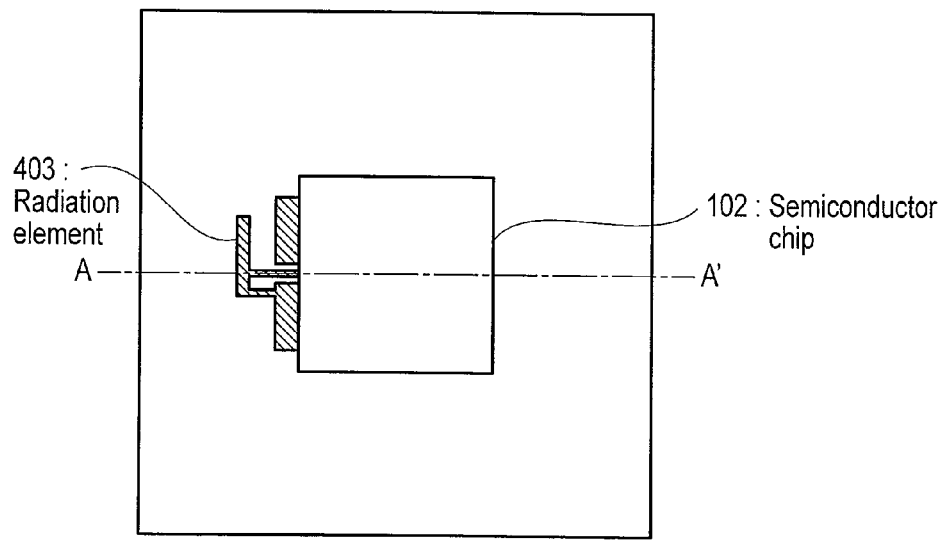
FIG. 4A is a top plan view illustrating an example where a radiation element is formed of part of an inverted F-shaped antenna.
Figure 4B:
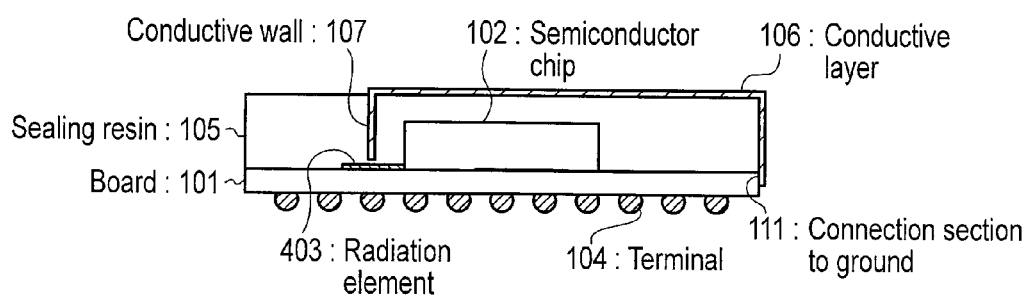
FIG. 4B is a cross-sectional view taken along line A-A' of FIG. 4A.
Figure 6A:
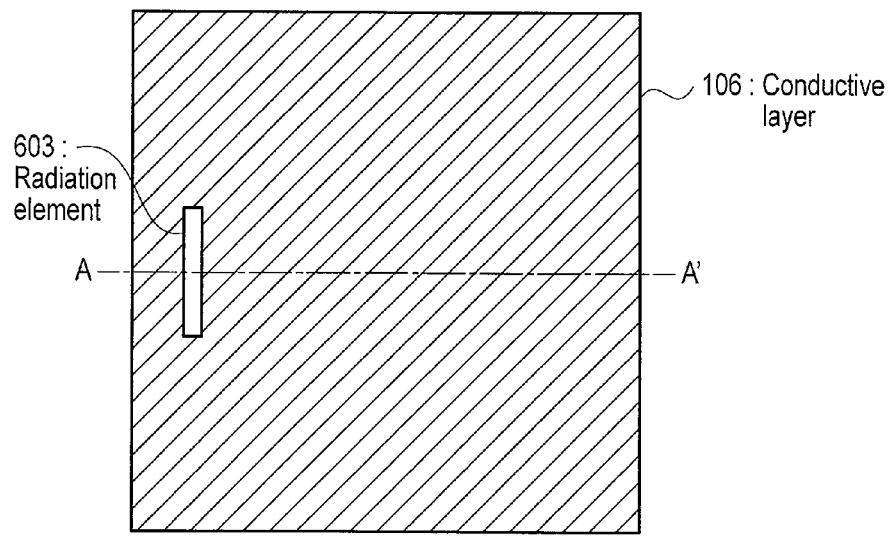
FIG. 6A is a top plan view illustrating an example where a radiation element is a slot antenna.
Figure 6B:
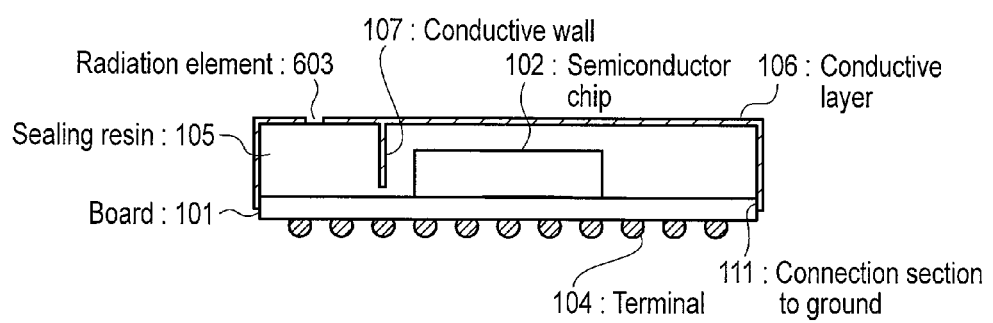
FIG. 6B is a cross-sectional view taken along line A-A' of FIG. 6A.

FIGS. 2A and 2B show an example where a radiation element 203 provides the entire dipole antenna. FIGS. 3A and 3B show an example where a radiation element 303 provides part of a loop antenna. The radiation element 303 may provide the entire loop antenna. FIGS. 4A and 4B show an example where a radiation element 403 provides part of an inverted F-shaped antenna. The radiation element 403 may provide the entire inverted F-shaped antenna. FIGS. 5A and 5B show an example where the radiation element shown in FIGS. 1A to 1D provides the entire patch antenna. The radiation element 503 of FIGS. 5A and 5B may provide part of the patch antenna. FIGS. 6A and 6B show an example where the radiation element shown in FIGS. 1A to 1D provides a slot antenna. In FIGS. 6A and 6B, the slot (also referred to as an aperture) serving as a radiation element 603 is formed in the conductive layer 106. In FIG. 6A, although the slot is formed in the upper surface of the semiconductor module 100, it may be formed in a side surface of the semiconductor module 100.

The radiation element may provide a part of an antenna, or the entire antenna, which is other than the dipole antenna, the loop antenna, the inverted F-shaped antenna, a Yagi antenna, the patch antenna or the slot antenna. Yet further, although those figures each show only one radiation element, a plurality of radiation elements may be employed.

Referring then to FIG. 7, a description will be given of simulation results associated with electromagnetic shielding characteristics obtained when the radiation element 303 is used as part of the loop antenna as shown in FIGS. 3A and 3B.

The electromagnetic shielding characteristics shown in FIG. 7 indicate to what degrees the near magnetic field intensity is reduced, compared to that obtained when the semiconductor module 100 does not employ the conductive layer 106 or the conductive wall 107. The uppermost one of the three curves in the graph indicates the case where the entire semiconductor module is covered with a conductive layer. The middle one of the three curves indicates the case where the semiconductor module is covered with the conductive layer 106 and the conductive wall 107 as shown in FIGS. 1A to 1D, and the lowermost one indicates the case where the semiconductor module is covered with only the conductive layer 106 and without the conductive wall 107 shown in FIGS. 1A to 1D.

In the case where the semiconductor module is covered with both the conductive layer 106 and the conductive wall 107 as shown in FIGS. 1A to 1D, the electromagnetic shielding characteristics are increased by about 3 dB, compared to the case where the semiconductor module is covered with only the conductive layer 106, although it is not so increased as in the case where the entire semiconductor module is covered with the conductive layer. If the entire semiconductor module is covered with the conductive layer, the radiation antenna does not work as an antenna. Therefore, the entire semiconductor chip 102 cannot be covered with the conductive layer when the radiation element 103 working as an antenna is provided on the semiconductor module 100. By providing, between the semiconductor chip 102 and the radiation element 103, the conductive wall 107 connected to the conductive layer 106 covering the sealing resin 105, as is shown in FIGS. 1A and 1B, the unintentional electromagnetic field generated by the semiconductor chip and the wiring (not shown) of the board 101 can be suppressed while desired electromagnetic waves are efficiently radiated or received by the radiation element 103.

In the above-described first embodiment, by providing, between the semiconductor chip and the radiation element, the conductive wall connected to the conductive layer covering the sealing resin, the unintentional electromagnetic field generated by the semiconductor chip and the wiring of the board can be suppressed while desired electromagnetic waves are efficiently radiated or received by the radiation element.

Second Embodiment

A wireless device according to a second embodiment differs from the first embodiment in that the former employs a plurality of radiation elements in the semiconductor module 100.

Figure 8C:
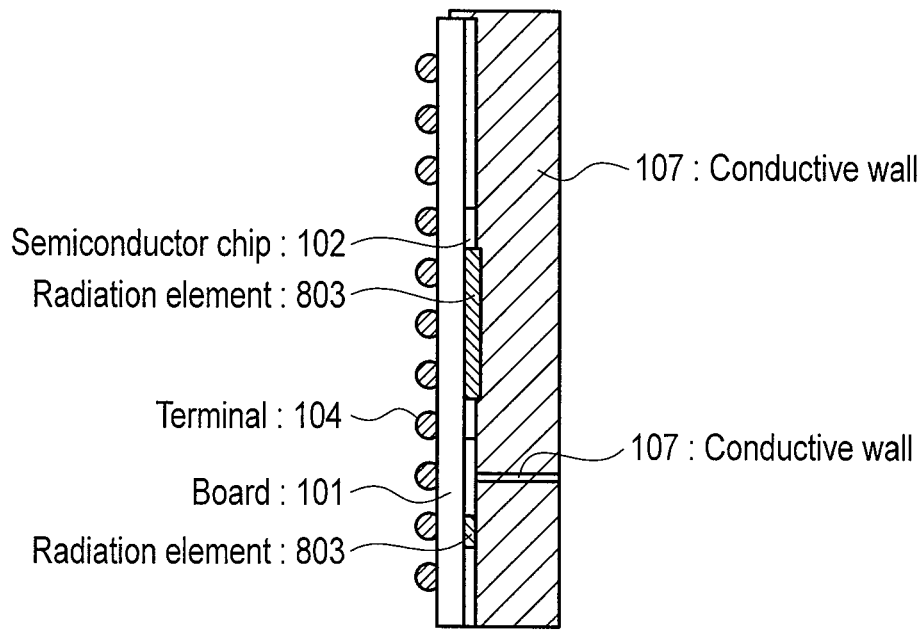
FIG. 8C is a side view taken in a negative X-direction in FIG. 8A.
Figure 8D:
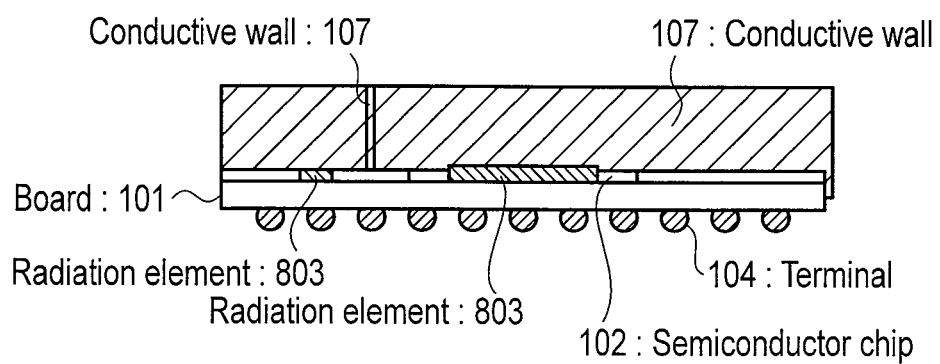
FIG. 8D is a side view taken in a negative Y-direction in FIG. 8A.

Referring to FIGS. 8A to 8D, a description will be given of the second embodiment. FIG. 8A is a top plan view schematically illustrating the wireless device of the second embodiment. FIG. 8B is a cross-sectional view taken along line A-A' of FIG. 8A. FIG. 8C is a side view taken in a negative X-direction in FIG. 8A, and illustrating a state in which the sealing resin 105 is removed from the semiconductor module shown FIG. 8A. FIG. 8D is a side view taken in a negative Y-direction in FIG. 8A.

The wireless device shown in FIGS. 8A to 8D employs two radiation elements 103 and two conductive walls 107 similar to the radiation element 103 and the conductive walls 107 shown in FIGS. 1A to 1D, respectively. The two radiation elements 103 can be used as, for example, diversity antennas, array antennas, and transmission and reception antennas. When the two radiation elements are used as diversity antennas, they can be used as, for example, space diversity antennas, pattern diversity antennas, polarization diversity antennas, and can obtain a diversity gain. When the two radiation elements are used as array antennas, they can enhance directivity or can perform beam-forming. When the two radiation elements are used as transmission and reception antennas, no transmission/reception switch is required.

Since the two radiation elements 103 shown in FIGS. 8A to 8D are isolated from each other by the conductive wall 107, they are not liable to be coupled, i.e., can have a high isolation characteristic. Further, like the wireless device shown in FIGS. 1A to 1D, the wireless device of the second embodiment can suppress the unintentional electromagnetic field generated by the semiconductor chip and the wiring of the board, with the radiation elements 103 permitted to efficiently radiate or receive electromagnetic waves.

Although the second embodiment employs two radiation elements 103 and two conductive walls 107, it may employ three or more radiation elements and conductive walls. Yet further, the number of the radiation elements 103 may not be equal to that of the conductive walls 107.

The above-described second embodiment has an advantage, as well as the advantage of the first embodiment, that the radiation elements can be used as diversity antennas, array antennas, and transmission and reception antennas. Furthermore, since two radiation elements are isolated from each other by the conductive wall, they are not liable to be coupled, i.e., can have a high isolation characteristic.

Third Embodiment

A wireless device according to a third embodiment differs from the wireless devices of the first and second embodiments in that in the former, the conductive wall 107 is connected to the ground of the board 101.

Figure 9A:
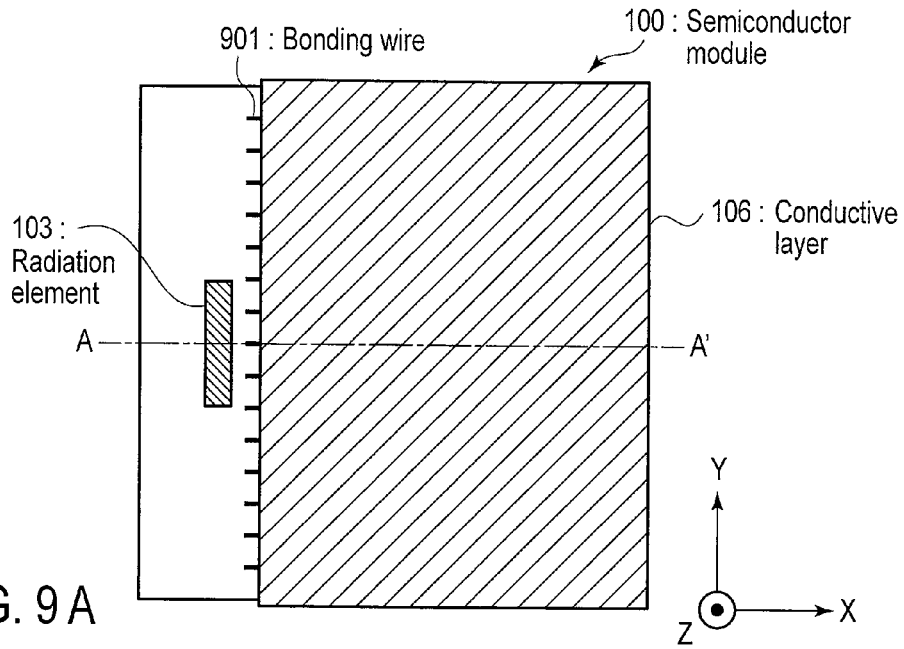
FIG. 9A is a top plan view schematically illustrating a wireless device according to a third embodiment.
Figure 9B:
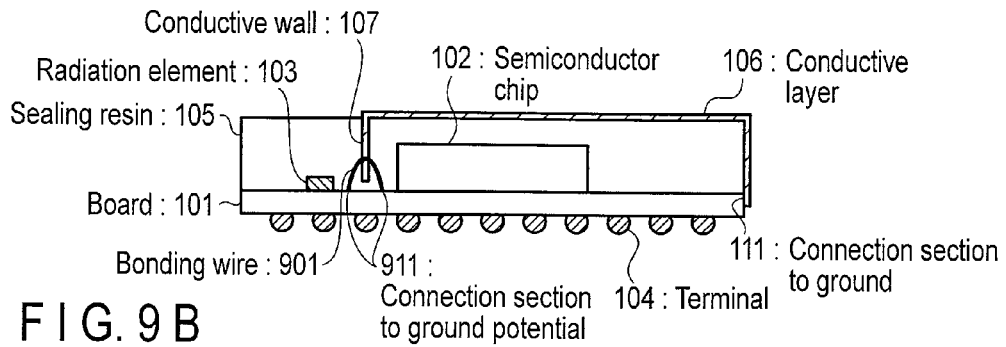
FIG. 9B is a cross-sectional view taken along line A-A' of FIG. 9A.
Figure 9C:
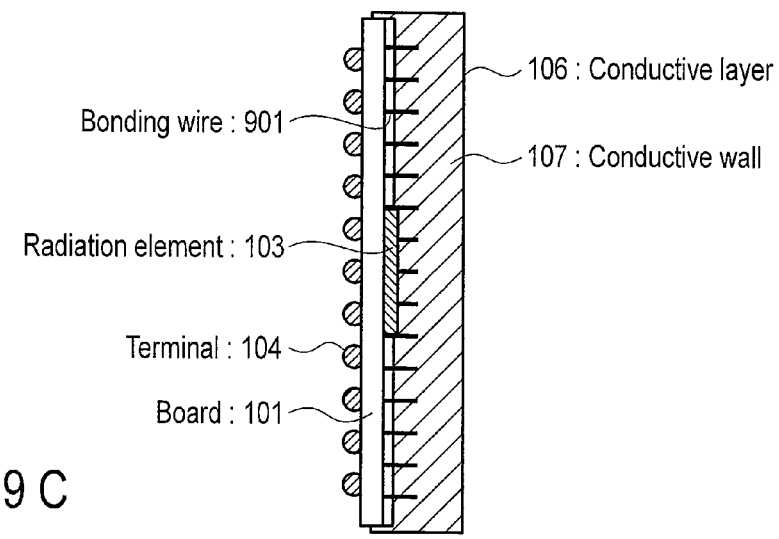
FIG. 9C is a side view taken in a negative X-direction in FIG. 9A.

Referring to FIGS. 9A to 9C, the wireless device of the third embodiment will be described. FIG. 9A is a top plan view schematically illustrating the wireless device of the third embodiment. FIG. 9B is a cross-sectional view taken along line A-A' of FIG. 9A. FIG. 9C is a side view taken in a negative X-direction in FIG. 9A, and illustrating a state in which the sealing resin 105 is removed from the semiconductor module of FIG. 9A.

In the wireless device shown in FIGS. 9A to 9C, the conductive wall 107 is connected to the ground of the board 101 via bonding wires 901. One or both ends of each bonding wire 901 are connected to the ground of the board 101, and the central portion of each of the bonding wires 901 is connected to the conductive wall 107. The central portion means the portion located at substantially the same distance from the opposite ends. The bonding wires 901 are formed in XZ plane.

If the conductive wall 107 is not connected to the ground, there is no leakage path of the current occurring in the conductive wall 107, whereby an electromagnetic field is re-radiated by the conductive wall 107 to thereby suppress the shielding effect. A higher shielding effect can be obtained by connecting the conductive wall 107 to the ground of the board 101 as shown in FIGS. 9A to 9C.

Figure 10A:
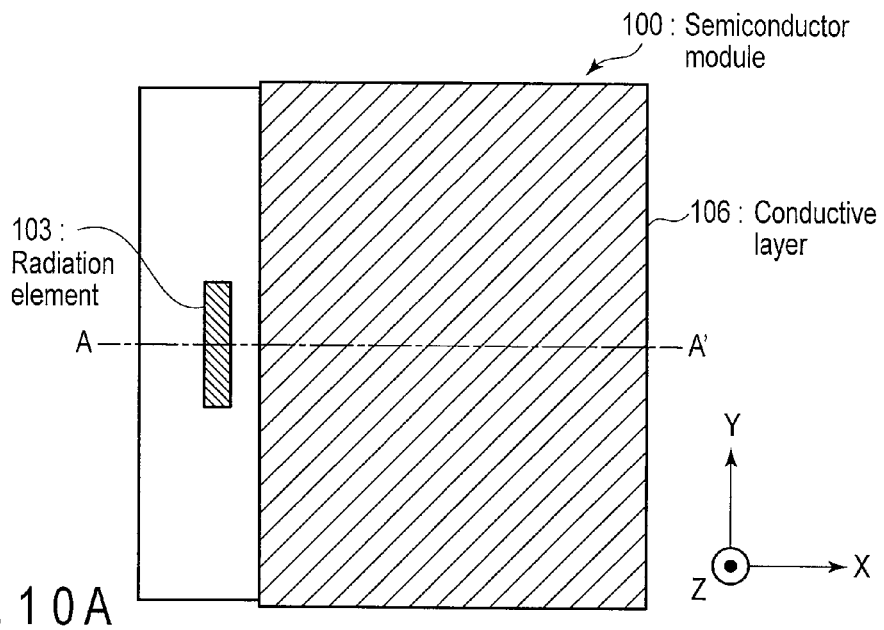
FIG. 10A is a top plan view schematically illustrating a wireless device according to a first modification of the third embodiment.
Figure 10B:
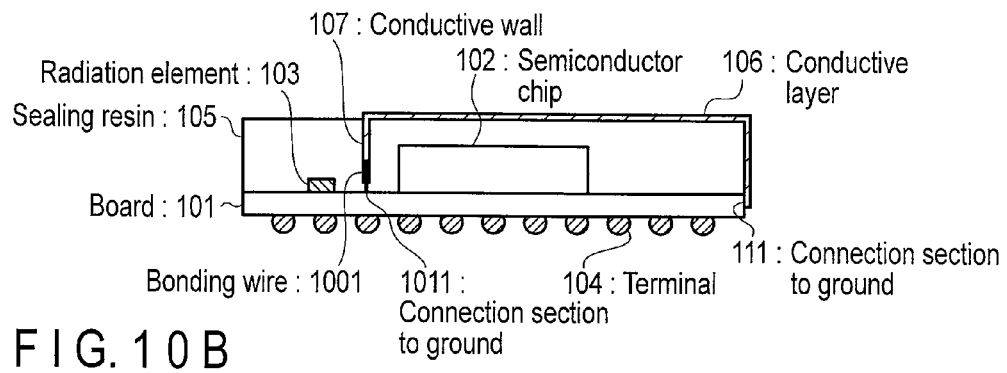
FIG. 10B is a cross-sectional view taken along line A-A' of FIG. 10A.
Figure 10C:
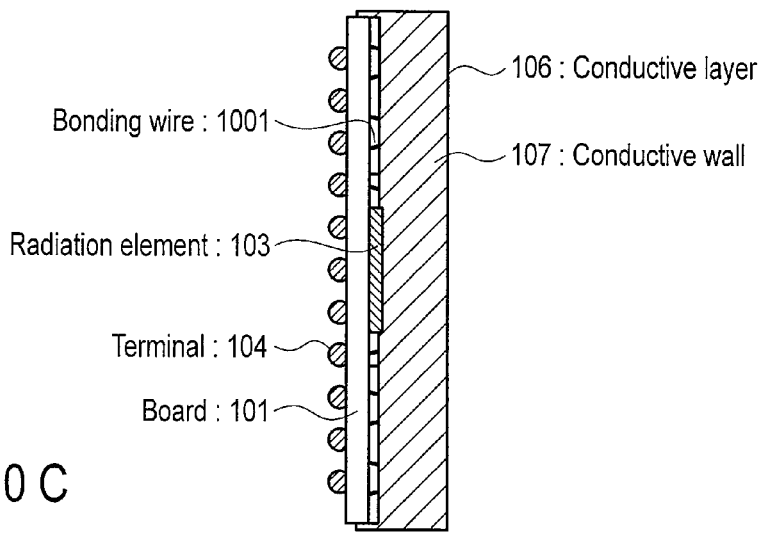
FIG. 10C is a side view taken in a negative X-direction in FIG. 10A.

FIGS. 10A to 10C show a first modification of the structure of FIGS. 9A to 9C. FIGS. 10A to 10C show bonding wires 1001 obtained by rotating the orientation of the bonding wires 901 shown in FIGS. 9A to 9C through 90° in the XY plane. FIG. 10B is a cross-sectional view taken along line A-A' of FIG. 10A. FIG. 10C is a side view taken in the negative X-direction in FIG. 10A, and illustrating a structure obtained when the sealing resin 105 is removed from the semiconductor module of FIG. 10A. One or both ends of each bonding wire 1001 are connected to the ground of the board 101 via ground connecting portions 1011, and the central portion of each bonding wire 1001 is connected to the conductive wall 107. The bonding wires 1001 are formed in YZ plane.

Figure 11A:
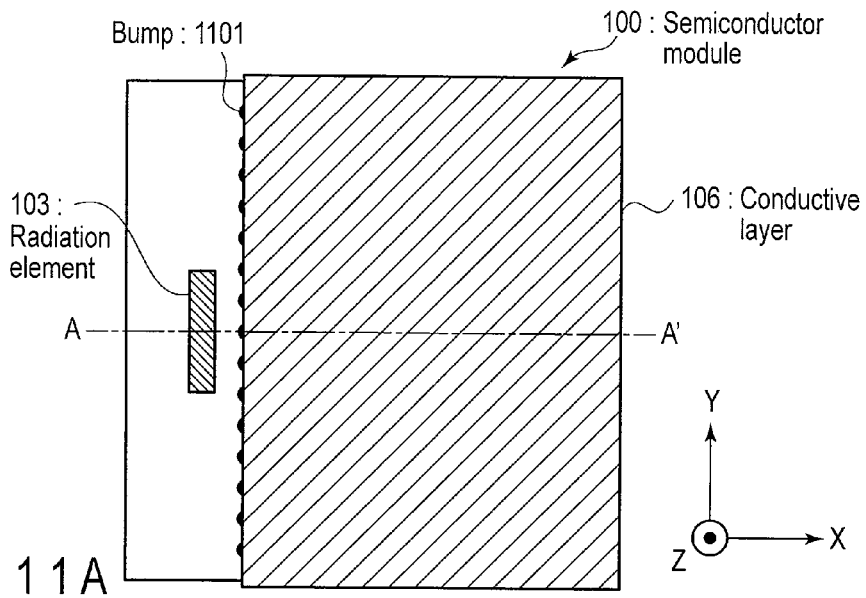
FIG. 11A is a top plan view schematically illustrating a wireless device according to a second modification of the third embodiment.
Figure 11B:
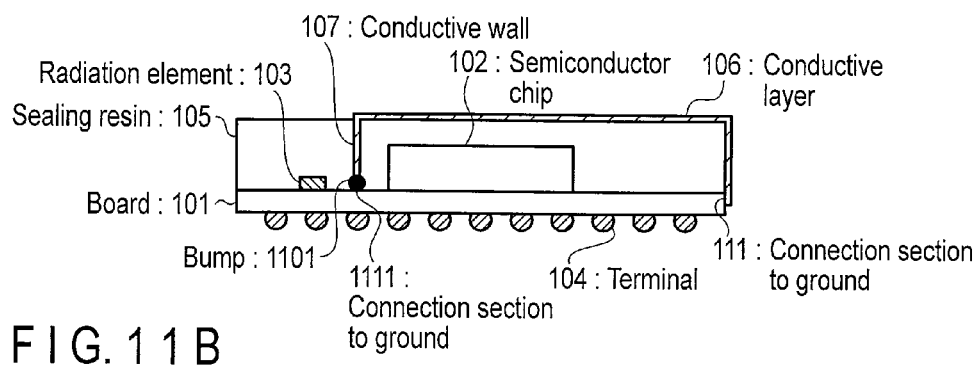
FIG. 11B is a cross-sectional view taken along line A-A' of FIG. 11A.
Figure 11C:
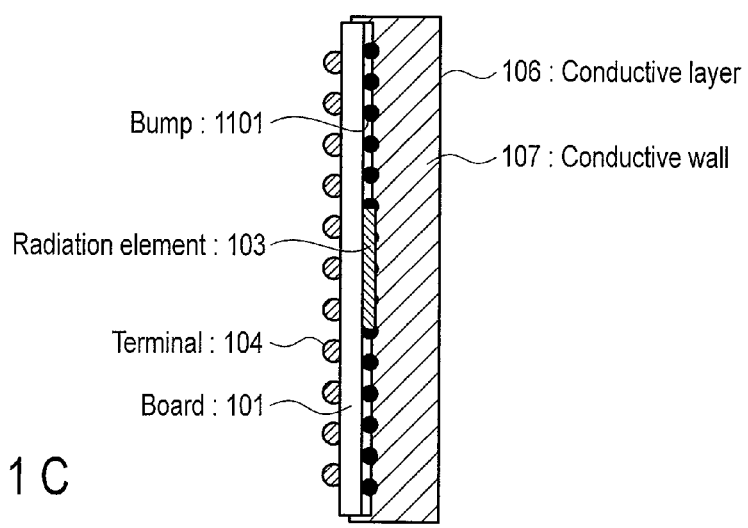
FIG. 11C is a side view taken in a negative X-direction in FIG. 10A.

FIGS. 11A to 11C show a second modification of the structure of FIGS. 9A to 9C. In this modification, the conductive wall 107 is connected to the ground of the board 101 via bumps 1101 that are connected to the ground via ground connecting portions 1111. FIG. 11B is a cross-sectional view taken along line A-A' of FIG. 11A. FIG. 11C is a side view taken in the negative X-direction in FIG. 11A, and illustrating a structure obtained when the sealing resin 105 is removed from the semiconductor module of FIG. 11A. Alternatively, the conductive wall 107 may be formed to reach the board 101 without the bumps 1101.

In the wireless devices shown in FIGS. 10A to 10C and 11A to 11C, since the conductive wall 107 is connected to the ground of the board 101, re-radiation of an electromagnetic field from the conductive wall 107 is suppressed to thereby exhibit a higher shielding effect, as in the wireless device shown in FIGS. 9A to 9C.

As described above, since in the third embodiment, the conductive wall is connected to the ground of the board, re-radiation of an electromagnetic field from the conductive wall is suppressed to thereby exhibit a higher shielding effect.

Fourth Embodiment

A wireless device according to a fourth embodiment differs from the wireless devices of the first to third embodiments in that in the former, another conductive wall is provided in addition to the conductive wall 107.

Figure 12A:
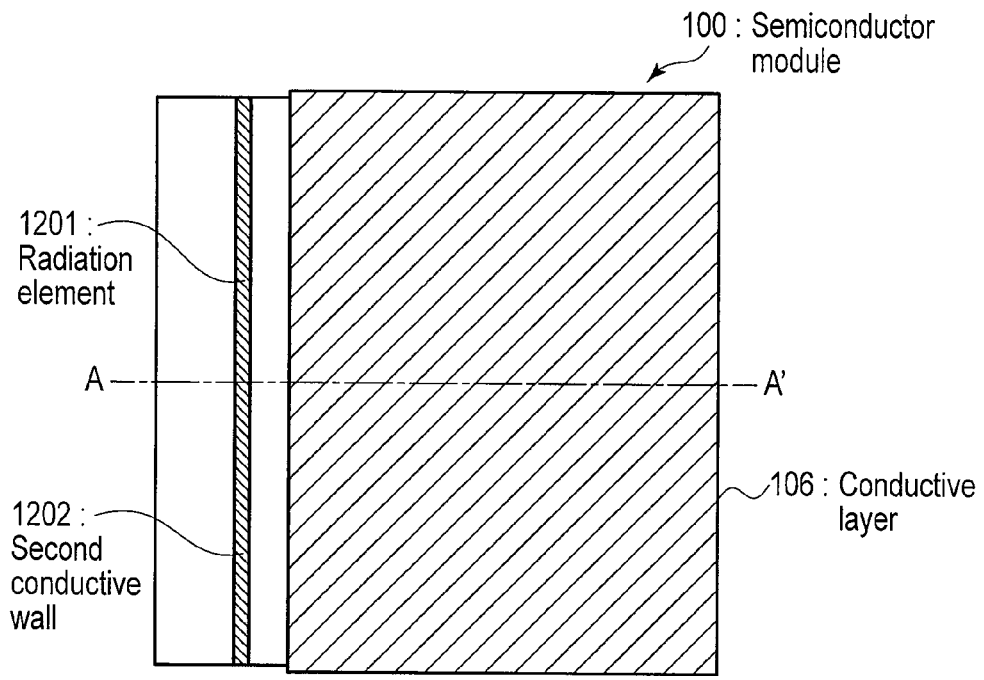
FIG. 12A is a top plan view schematically illustrating a wireless device according to a fourth embodiment.
Figure 12B:
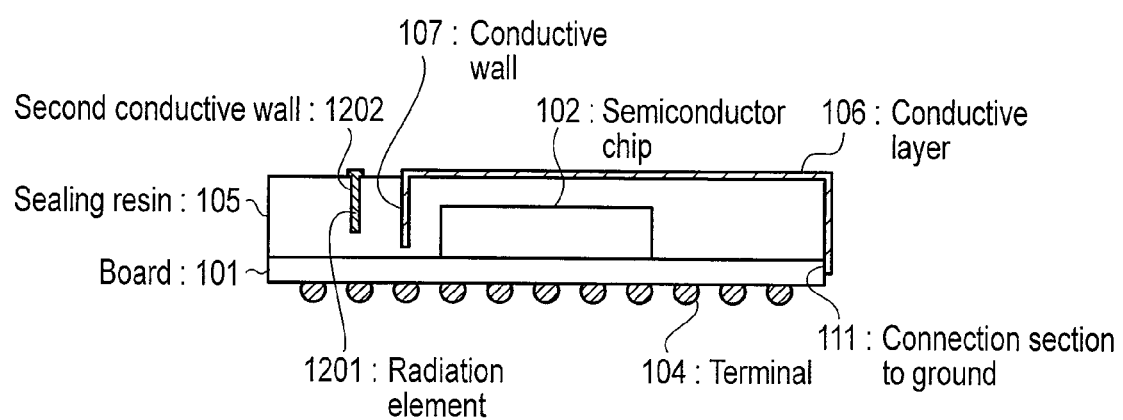
FIG. 12B is a cross-sectional view taken along line A-A' of FIG. 12A.

Referring to FIGS. 12A and 12B, the wireless device of the fourth embodiment will be described. FIG. 12A is a top plan view schematically illustrating the wireless device of the fourth embodiment, and FIG. 12B is a cross-sectional view taken along line A-A' of FIG. 12A. In the wireless device shown in FIGS. 12A and 12B, a second conductive wall 1202 is provided between the end portion of the sealing resin 105 at which no semiconductor chip 102 is interposed, and the conductive wall 107, and a radiation element 1201 is formed in the second conductive wall 1202. Namely, no semiconductor chip 102 exists between the conductive wall 107 and the above-mentioned end of the sealing resin 105. The radiation element 1201 is, for example, a dipole antenna, a loop antenna, an inverted F-shaped antenna, or a patch antenna. The supply of power to the radiation element 1201 is performed by electrically connecting the element 1201 to the wiring on the board 101 by, for example, bonding wires, bumps or electromagnetic coupling.

Thus, the second conductive wall 1202 is provided between the conductive wall 107 and the end portion of the sealing resin 105, and a radiation element 1201 is formed in the second conductive wall 1202. This means that a double wall structure is provided, thereby providing a higher shielding effect, and at the same time that the radiation element 1201 can efficiently radiate and receive electromagnetic waves.

Figure 13A:
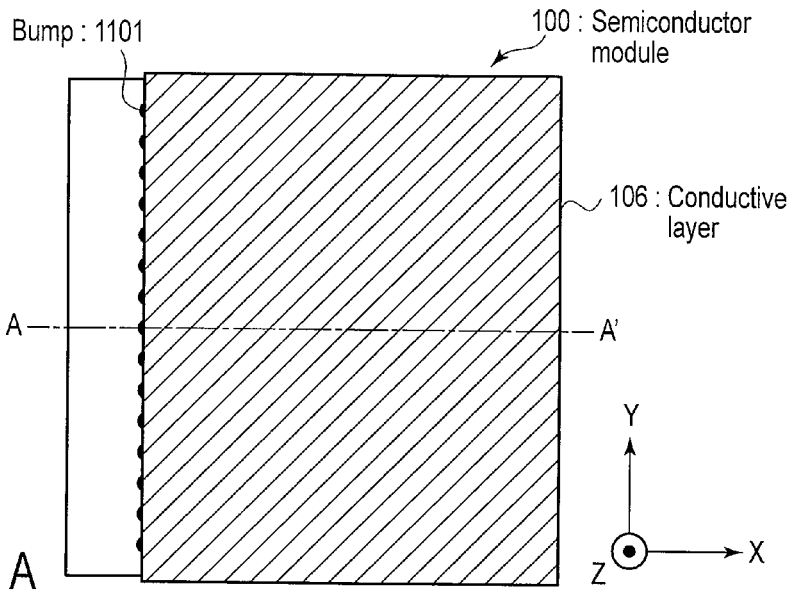
FIG. 13A is a top plan view schematically illustrating a wireless device according to a modification of the third embodiment.
Figure 13B:
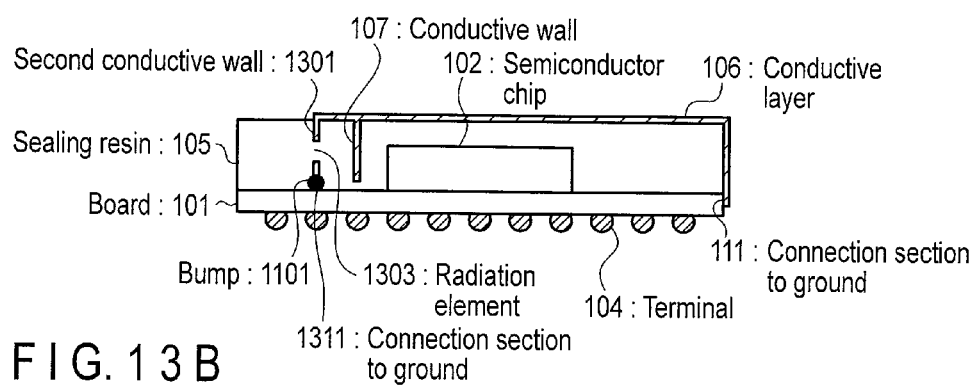
FIG. 13B is a cross-sectional view taken along line A-A' of FIG. 13A.
Figure 13C:
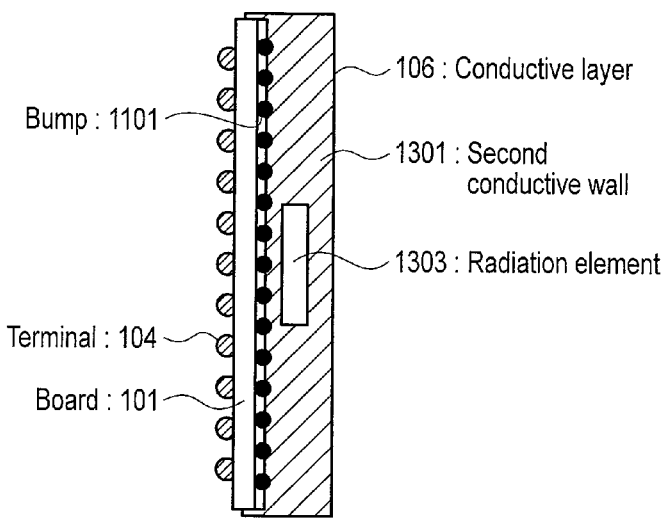
FIG. 13C is a side view taken in a negative X-direction in FIG. 13A.

The wireless device shown in FIGS. 13A and 13B is a modification of the wireless device of FIGS. 12A and 12B. FIG. 13B is a cross-sectional view taken along line A-A' of FIG. 13A. FIG. 13C is a side view taken in a negative X-direction in FIG. 13A, and illustrating a structure in which the sealing resin 105 is removed from the semiconductor module of FIG. 13A.

In the wireless device of FIGS. 13A and 13B, a radiation element 1303 as a slot element is formed in a second conductive wall 1301 that is formed integral as one body with the conductive layer 106 and the conductive wall 107. The conductive wall 107 is connected to ground connecting portions 1311 provided on the board 101 via bumps 1101. In FIGS. 13A and 13B, the slot element is formed only in the second conductive wall 1301. However, it may be formed in the conductive layer 106 and the conductive wall 107. Further, the slot element may be formed in the portion of the conductive layer 106 interposed between the conductive wall 107 and the second conductive wall 1301. In this case, the slot element is provided in the upper surface of the semiconductor module 100.

Like the wireless device of FIGS. 12A and 12B, the wireless device shown in FIGS. 13A and 13B has a double wall structure since the radiation element 1303 is formed in the second conductive wall 1201, thereby providing a higher shielding effect. In addition, the radiation element 1303 can efficiently radiate and receive electromagnetic waves.

As described above, in the fourth embodiment, the second conductive wall is provided between the first conductive wall and one end of the sealing resin, and the radiation element is formed in the second conductive wall. As a result, a double wall structure is formed to provide a higher shielding effect, and at the same time, the radiation element can efficiently radiate and receive electromagnetic waves.

Fifth Embodiment

A wireless device according to a fifth embodiment differs from that of fourth embodiment in that in the former, the radiation element is not sealed with a sealing resin.

Referring to FIGS. 14A and 14B, the wireless device of the fifth embodiment will be described. FIG. 14A is a top plan view schematically illustrating the wireless device of the fifth embodiment. FIG. 14B is a cross-sectional view taken along line A-A' FIG. 14A.

The wireless device of FIGS. 14A and 14B differs from the wireless device of the first embodiment only in that in the former, the radiation element 103 is not sealed with the sealing resin 105.

In the fifth embodiment, the conductive wall 107 connected to the conductive layer 106 that covers the sealing resin 105 is provided between the semiconductor chip 102 and the radiation element 103. With this structure, the unintentional electromagnetic field generated by the semiconductor chip 102 and the wiring (not shown) of the board 101 can be suppressed, and at the same time, the radiation element 103 can efficiently radiate and receive electromagnetic waves, as in the wireless device of FIG. 1. Further, since in this embodiment, the radiation element 103 is not sealed by the sealing resin 105, loss due to the dielectric loss tangent of the sealing resin 105 is reduced to thereby enhance the antenna radiation efficiency.

As described above, the fifth embodiment can provide an advantage, as well as the advantage of the first embodiment, that loss due to the dielectric loss tangent of the sealing resin 105 is reduced to thereby enhance the antenna radiation efficiency.

Sixth Embodiment

A wireless device according to a sixth embodiment differs from the device of the first embodiment in that in the former, only one conductive wall is provided, and a radiation element is formed in the conductive wall.

Figure 15C:
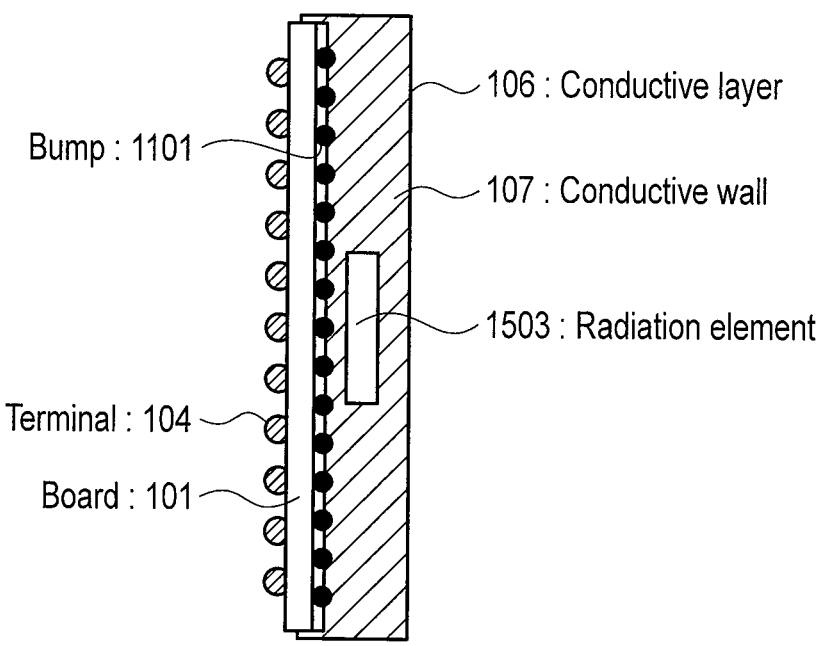
FIG. 15C is a side view taken in a negative X-direction in FIG. 15A.

Referring to FIGS. 15A to 15C, the wireless device of the sixth embodiment will be described. FIG. 15A is a top plan view schematically illustrating the wireless device of the sixth embodiment. FIG. 15B is a cross-sectional view taken along line A-A' of FIG. 15A. FIG. 15C is a side view taken in a negative X-direction in FIG. 15A.

The wireless device shown in FIGS. 15A to 15C is obtained by eliminating the radiation element 103 from the wireless device of the third embodiment shown in FIGS. 11A to 11C, and newly providing a radiation element 1503 in the conductive wall 107. The radiation element 1503 shown in FIGS. 15A to 15C is a slot antenna. However, another type of aperture antenna may be employed. Although the slot is formed only in the conductive wall 107, it may extend to the conductive layer 106. Alternatively, the slot may be formed only in the conductive layer 106. In this case, the slot is formed in the upper surface of the semiconductor module 100.

Since in the sixth embodiment, the conductive wall 107 is provided between an end of the sealing resin 105 and the semiconductor chip, and a slot as the radiation element 1503 is formed in the conductive wall 107, the distance between the slot and the semiconductor chip is shorter than in the case where the slot is formed in a side surface of the semiconductor module. This structure can reduce power feed loss. Furthermore, since a sealing resin is provided on the opposite surfaces of the conductive wall with the slot formed therein, the size of the slot can be reduced by wavelength shortening effect.

As shown in FIGS. 15A to 15C, in the sixth embodiment, the conductive wall 107 connected to the conductive layer 106 covering the sealing resin 105 is provided between the sealing resin 105 and the semiconductor chip 102, and the radiation element 1503 is formed in the conductive wall 107. By virtue of this structure, the unintentional electromagnetic field generated by the semiconductor chip 102 and the wiring (not shown) of the board 101 can be suppressed, and at the same time, the radiation element can efficiently radiate and receive electromagnetic waves.

As described above, the sixth embodiment, in which the radiation element is formed in the conductive wall, can suppress the unintentional electromagnetic field generated by the semiconductor chip and the wiring (not shown) of the board, while permitting the radiation element to efficiently radiate and receive electromagnetic waves.

Seventh Embodiment

A description will be given of an information processing apparatus and a storage apparatus according to a seventh embodiment, which employ one of the wireless devices according to the first to sixth embodiments, referring to FIGS. 16 and 17. The information processing apparatus is a wireless system capable of exchanging data, stills, or moving images and installing the wireless device.

Figure 16:
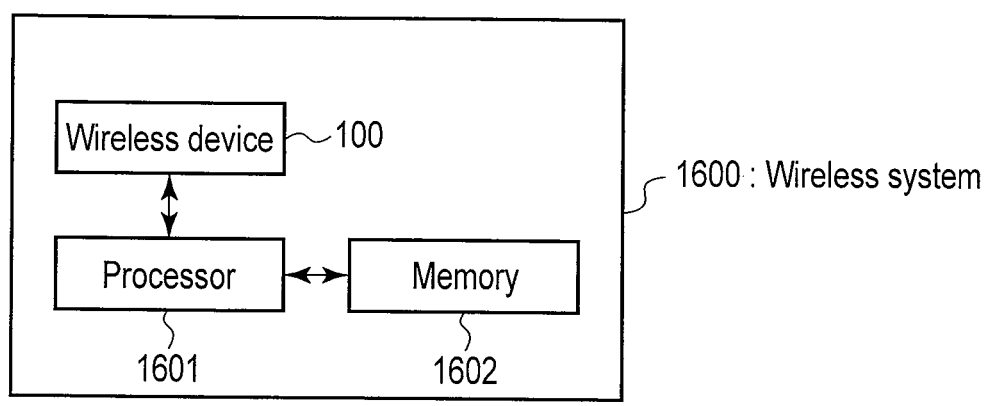
FIG. 16 is a block diagram illustrating a wireless device according to a seventh embodiment.

The wireless system 1600 shown in FIG. 16 comprises a wireless device 100, a processor 1601 and a memory 1602.

The wireless device 100 transmits and receives data to and from an external device. The wireless device 100 is formed of one of the semiconductor module 100 according to the first to sixth embodiments.

The processor (also called a controller) 1601 processes data received from and transmitted to the wireless device 100.

The memory 1602 stores data received from the processor 1601, and provides data to be transmitted to the processor 1601.

Figure 17:
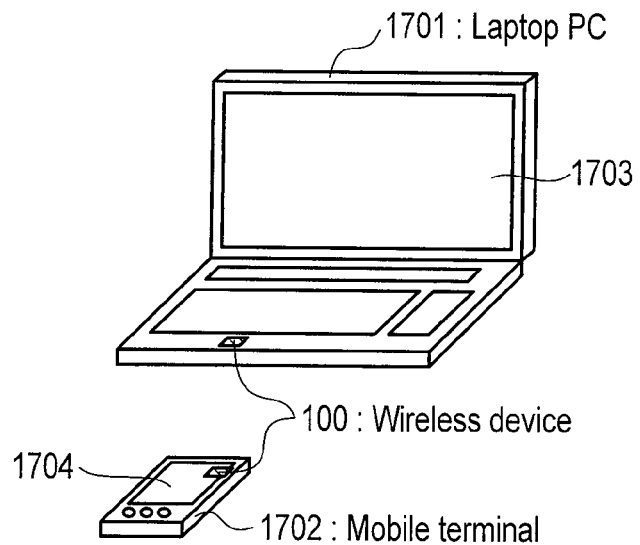
FIG. 17 is a view illustrating a wireless apparatus example provided with a wireless device.

Referring to FIG. 17, examples of the wireless system with the wireless device 100 will be described.

In these examples, the wireless system examples are a laptop personal computer (laptop PC) 1701 and a mobile terminal 1702. The laptop PC 1701 and the mobile terminal 1702 comprise displays 1703 and 1704 for displaying still and moving images, respectively. The laptop PC 1701 and the mobile terminal 1702 each comprise a central processing unit (CPU) (also called a controller), a memory, etc. The laptop PC 1101 and the mobile terminal 1102 further each comprise an internal or external wireless device 100, through which data communication is performed using a frequency of, for example, a millimeter waveband. In the seventh embodiment, the laptop PC 1701 and the mobile terminal 1702 may incorporate the semiconductor package 100 according to any one of the aforementioned embodiments.

Further, if the wireless devices incorporated in the laptop PC 1701 and the mobile terminal 1702 are arranged so that their directions, in which high directivity is obtained, are opposed to each other, exchange of data therebetween can be performed with high efficiency.

Although FIG. 17 shows the laptop PC 1701 and the mobile terminal 1702, the seventh embodiment is not limited to them, but the wireless devices may be installed in, for example, a television receiver, a digital camera, a memory card, etc.

Figure 18:
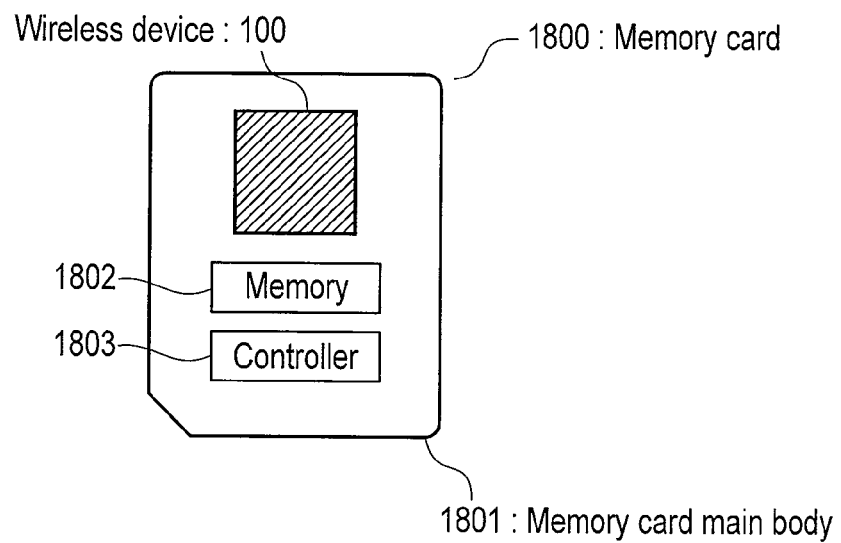
FIG. 18 is a memory card example provided with a wireless device.

Referring then to FIG. 18, a description will be given of a case where the wireless device is installed in a storage device. In the example of FIG. 18, the storage device is a memory card 1800.

As shown in FIG. 18, the memory card 1800 comprises the wireless device 100 and a memory card main body 1801, and can communicate with, for example, a laptop PC, a mobile terminal, or a digital camera, via the wireless device 100. The memory card main body 1801 comprises a memory 1802 for storing data, and a controller 1803 for controlling the entire device.

In the above-described seventh embodiment, by installing the semiconductor package in an information processing apparatus or storage device, such as a laptop PC, a mobile terminal, or a memory card, which performs wireless data communication, data transmission or reception can be performed with high efficiency.

In the embodiments described above, by covering the sealing resin surface of the semiconductor package with a conductive layer, shielding performance against unintentional electromagnetic waves can be imparted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wireless device comprising:
a board;
a semiconductor chip mounted on the board and including a transmission/reception circuit;
a radiation element formed on the board;
a sealing resin sealing the semiconductor chip;
a conductive layer covering at least a portion of a surface of the sealing resin; and
a first conductive wall provided between the semiconductor chip and the radiation element, and connected to the conductive layer.

2. The device according to claim 1, wherein the radiation element is sealed with the sealing resin.

3. The device according to claim 1, wherein the radiation element is a slot antenna.

4. The device according to claim 1, wherein the conductive layer is connected to a ground of the board.

5. The device according to claim 1, wherein the first conductive wall is connected to a ground of the board.

6. The device according to claim 1, further comprising a second conductive wall provided between an end of the sealing resin and the first conductive wall, no semiconductor chip being interposed between the end of the sealing resin and the first conductive wall, the radiation element being formed in the second conductive wall.

7. An information processing apparatus comprising:
the wireless device according to claim 1;
a controller configured to process data received from and transmitted to the wireless device;
a memory configured to store the data; and
a display unit configured to display an image based on the data.

8. A storage device comprising:
the wireless device according to claim 1;
a controller configured to process data received from and transmitted to the wireless device; and
a memory configured to store the data.

9. A wireless device comprising:
a board;
a semiconductor chip provided on the board and including a transmission/reception circuit;
a sealing resin sealing the semiconductor chip;
a conductive layer covering at least a portion of a surface of the sealing resin;
a conductive wall provided between an end of the sealing resin and the semiconductor chip; and
a radiation element formed in the conductive wall.

10. A wireless device comprising:
a board;
a semiconductor chip provided on the board and including a transmission/reception circuit;
a sealing resin sealing the semiconductor chip;
a first conductive wall provided between the semiconductor chip and an end of the sealing resin; and
a conductive layer covering at least a portion of a surface of the sealing resin and connected to the first conductive wall,
wherein a slot is formed in one of the conductive layer and the first conductive wall.

11. The device according to claim 10, further comprising a second conductive wall provided between the semiconductor chip and the slot, and connected to the conductive layer.

12. The device according to claim 10, wherein a slot is formed in the conductive layer between an end of the sealing resin and the first conductive wall, no semiconductor chip being interposed between the end of the sealing resin and the first conductive wall.

* * * * *